(12) United States Patent
Xu et al.

(10) Patent No.: US 12,550,551 B2
(45) Date of Patent: Feb. 10, 2026

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yuanjie Xu, Beijing (CN); Weiyun Huang, Beijing (CN); Lili Du, Beijing (CN); Yudiao Cheng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 553 days.

(21) Appl. No.: 17/926,648

(22) PCT Filed: Dec. 29, 2021

(86) PCT No.: PCT/CN2021/142721
§ 371 (c)(1),
(2) Date: Nov. 21, 2022

(87) PCT Pub. No.: WO2023/123138
PCT Pub. Date: Jul. 6, 2023

(65) Prior Publication Data
US 2024/0244898 A1 Jul. 18, 2024

(51) Int. Cl.
*H10K 59/131* (2023.01)
(52) U.S. Cl.
CPC ................... *H10K 59/131* (2023.02)
(58) Field of Classification Search
CPC ............... G09G 3/3233; G09G 3/3266; G09G 2300/0408; G09G 2300/0426;
(Continued)

(56) References Cited

U.S. PATENT DOCUMENTS

2018/0190202 A1* 7/2018 Kong .................. G09G 3/002
2021/0126080 A1 4/2021 Kim et al.
(Continued)

FOREIGN PATENT DOCUMENTS

CN 109493797 A * 3/2019 .......... G09G 3/3225
CN 110047386 A 7/2019
(Continued)

OTHER PUBLICATIONS

Partial supplementary European search report of counterpart European application No. 21969505.3 issued on Jul. 22, 2024, 15 pages.
(Continued)

*Primary Examiner* — Stacy Khoo
(74) *Attorney, Agent, or Firm* — XSENSUS LLP

(57) ABSTRACT

Provided is a display panel. The display panel includes: a substrate including a light-transmissive display region and a conventional display region, a plurality of first pixel drive circuits, a plurality of first light-emitting devices, and a plurality of second pixel drive circuits that are disposed in the conventional display region, and a plurality of second light-emitting devices disposed in the light-transmissive display region. The plurality of first pixel drive circuits includes a plurality of groups of the first pixel drive circuits. The plurality of first light-emitting devices are electrically connected to the plurality of first pixel drive circuit. The plurality of second pixel drive circuits includes a plurality of groups of the second pixel drive circuits. The plurality of second light-emitting devices are electrically connected to the plurality of groups of the second pixel drive circuits by a conductive wiring.

20 Claims, 10 Drawing Sheets

(58) Field of Classification Search
CPC ......... G09G 2300/0842; H10K 59/121; H10K 59/1213; H10K 59/131; H10K 59/65
See application file for complete search history.

(56) References Cited

U.S. PATENT DOCUMENTS

| | | |
|---|---|---|
| 2021/0193758 A1 | 6/2021 | Choi et al. |
| 2022/0069047 A1 | 3/2022 | Yang et al. |
| 2022/0157895 A1 | 5/2022 | Xu et al. |
| 2022/0352292 A1 | 11/2022 | Yang et al. |
| 2024/0203311 A1 * | 6/2024 | Wang ..................... G09G 3/20 |

FOREIGN PATENT DOCUMENTS

| | | | |
|---|---|---|---|
| CN | 110491905 A | | 11/2019 |
| CN | 111048005 A | | 4/2020 |
| CN | 111091773 A | * | 5/2020 |
| CN | 111916486 A | | 11/2020 |
| CN | 112259602 A | | 1/2021 |
| CN | 113067961 A | | 7/2021 |
| CN | 113707092 A | | 11/2021 |
| CN | 113744649 A | | 12/2021 |
| CN | 113764460 A | | 12/2021 |

OTHER PUBLICATIONS

Extended European search report of counterpart European application No. 21969505.3 issued on Oct. 14, 2024, 13 pages.

* cited by examiner

DISPLAY PANEL AND DISPLAY DEVICE

CROSS-REFERENCE TO RELATED APPLICATION

The present disclosure is a U.S. national stage of international application No. PCT/CN2021/142721, filed on Dec. 29, 2021, the content of which is herein incorporated by reference in its entirety.

TECHNICAL FIELD

The present disclosure relates to the technical field of displays, and in particular, relates to a display panel and a display device.

BACKGROUND

Currently, a display device typically includes a photosensitive sensor such as an image sensor to implement a photographing function or a biometric recognition function.

SUMMARY

Embodiments of the present disclosure provide a display panel and a display device. The technical solutions are as follows.

According to one aspect of the embodiments of the present disclosure, a display panel is provided. The display panel includes;
- a substrate, including a light-transmissive display region and a conventional display region disposed at a periphery of the light-transmissive display region;
- a plurality of first pixel drive circuits disposed in the conventional display region, including a plurality of groups of the first pixel drive circuits, wherein each group of the plurality of groups of the first pixel drive circuits is arranged along a first direction, and the plurality of groups of the first pixel drive circuits are arranged along a second direction, the first direction being intersected with the second direction;
- a plurality of first light-emitting devices disposed in the conventional display region, wherein the plurality of first light-emitting devices are electrically connected to the plurality of first pixel drive circuits, orthographic projections of the plurality of first light-emitting devices on the substrate being at least partially overlapped with orthographic projections of the plurality of first pixel drive circuits on the substrate;
- a plurality of second pixel drive circuits disposed in the conventional display region, including a plurality of groups of the second pixel drive circuits, wherein each group of the plurality of groups of the second pixel drive circuits is arranged along the first direction, and the plurality of groups of the first pixel drive circuits are arranged along the second direction and spaced apart between the plurality of groups of the first pixel drive circuits; and
- a plurality of second light-emitting devices disposed in the light-transmissive display region, wherein the plurality of second light-emitting devices are electrically connected to the plurality of groups of the second pixel drive circuits by a conductive wiring.

In some embodiments, the plurality of second light-emitting devices include a plurality of groups of the second light-emitting devices, wherein each group of the plurality of groups of the second light-emitting devices is arranged along the first direction, and the plurality of groups of the second light-emitting devices are arranged along the second direction, at least one group of the second pixel drive circuits in the plurality of groups of the second pixel drive circuits being electrically connected to at least one group of the second light-emitting devices in the plurality of groups of the second light-emitting devices.

In some embodiments, an arrangement direction of the at least one group of the second pixel drive circuits and an arrangement direction of the corresponding at least one group of the second light-emitting devices are parallel to the first direction, and the at least one group of the second pixel drive circuits is disposed on at least one side, in the first direction, of the corresponding at least one group of the second light-emitting devices.

In some embodiments, the at least one group of the second pixel drive circuits is disposed on both sides, in the first direction, of the corresponding at least one group of the second light-emitting devices.

In some embodiments, the at least one group of the second pixel drive circuits in the plurality of groups of the second pixel drive circuits includes a first sub-pixel drive circuit group and a second sub-pixel drive circuit group, the first sub-pixel drive circuit group and the second sub-pixel drive circuit group being symmetrically disposed with respect to the light-transmissive display region.

In some embodiments, the plurality of second light-emitting devices include a plurality of groups of the second light-emitting devices, wherein each group of the plurality of groups of the second light-emitting devices is arranged along the second direction, and the plurality of groups of the second light-emitting devices are arranged along the first direction, at least one group of the second pixel drive circuits in the plurality of groups of the second pixel drive circuits being electrically connected to at least one group of the second light-emitting devices in the plurality of groups of the second light-emitting devices.

In some embodiments, the plurality of second light-emitting devices include a plurality of groups of the second light-emitting devices, wherein each group of the plurality of groups of the second light-emitting devices is arranged along a third direction, and the plurality of groups of the second light-emitting devices are arranged along a fourth direction, the first direction, the second direction, the third direction, and the fourth direction being not coincided.

In some embodiments, the display panel further includes a plurality of groups of virtual pixel drive circuits disposed in the conventional display region, wherein at least one group of the plurality of groups of the virtual pixel drive circuits is arranged along the first direction and is disposed on a side, distal from the light-transmissive display region, of at least one group of the second pixel drive circuits.

In some embodiments, the display panel further includes a plurality of groups of virtual pixel drive circuits disposed in the conventional display region, wherein the plurality of groups of virtual pixel drive circuits are spaced apart between the plurality of groups of the second pixel drive circuits.

In some embodiments, the light-transmissive display region includes two light-transmissive sub-regions arranged along the first direction;
- wherein the second light-emitting device within one of the two light-transmissive sub-regions is correspondingly electrically connected to the second pixel drive circuit disposed on a first side of the one of the two light-transmissive sub-regions, the first side being a side, distal from another of the two light-transmissive sub-regions, of the one of the two light-transmissive sub-regions.

In some embodiments, areas of the two light-transmissive sub-regions are equal.

In some embodiments, the at least one group of the second pixel drive circuits in the plurality of groups of the second pixel drive circuits is adjacent to the light-transmissive display region.

In some embodiments, a plurality of the second pixel drive circuits corresponding to a group of the second light-emitting devices are successively arranged in the first direction.

In some embodiments, a group of the second pixel drive circuits is correspondingly electrically connected to three to eight groups of the second light-emitting devices.

In some embodiments, in the second direction, a distance between any group of the second light-emitting devices in at least two groups of the second light-emitting devices and a target group of the second pixel drive circuits is positively correlated with a first length, wherein the first length is a length of a conductive wiring between the second light-emitting device in the any group of the second light-emitting devices and the target group of the second pixel drive circuits.

In some embodiments, the display panel further includes a gate drive circuit disposed on the substrate;
wherein the gate drive circuit includes a plurality of first gate drive units correspondingly electrically connected to the plurality of groups of the first pixel drive circuits, and a plurality of second gate drive units correspondingly electrically connected to the plurality of groups of the second pixel drive circuits.

In some embodiments, the display panel further includes a gate drive circuit disposed on the substrate, and an independent signal wiring correspondingly electrically connected to the plurality of groups of the second pixel drive circuits; wherein the gate drive circuit includes a plurality of first gate drive units correspondingly electrically connected to the plurality of groups of the first pixel drive circuits; and the plurality of groups of the second pixel drive circuits are configured to be electrically connected to a drive chip by the independent signal wiring.

In some embodiments, the plurality of second gate drive units are electrically connected to the plurality of groups of the second pixel drive circuits by a first connection wiring; and
the at least one group of the virtual pixel drive circuits in the plurality of groups of virtual pixel drive circuits is disposed between the second gate drive unit and the at least one group of the second pixel drive circuits.

In some embodiments, the display panel further includes an initialization power supply bus disposed on the substrate, wherein the initialization power supply bus is disposed between the gate drive circuit and the virtual pixel drive circuit, and is connected to the second pixel drive circuit by a second connection wiring.

In some embodiments, in the second direction, a ratio of the number of the first pixel drive circuits to the number of the second pixel drive circuits is greater than 1.

In some embodiments, an arrangement density of the plurality of first light-emitting devices in the conventional display region is equal to an arrangement density of the plurality of second light-emitting devices in the light-transmissive display region.

According to another aspect of the embodiments of the present disclosure, a display device is provided. The display device includes: a photosensitive sensor and the display panel as described above, wherein an orthographic projection of a light incident surface of the photosensitive sensor on a substrate of the display panel is within a light-transmissive display region.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

Figure 1:
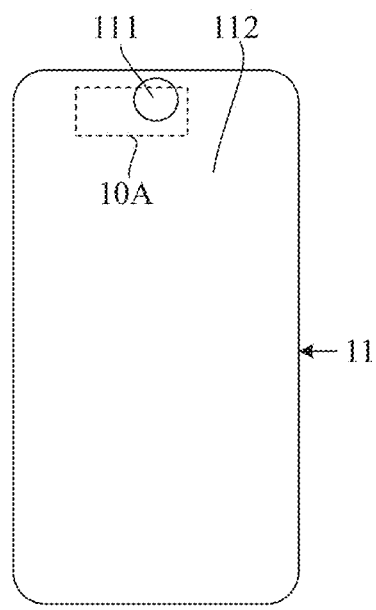
FIG. 1 is a schematic structural diagram of a display panel.

Some specific embodiments of the present disclosure illustrated by the above drawings, detailed description is given hereafter. Drawings and description are not intended to limit the scope of the conception of the present disclosure, but only to illustrate the concept of the present disclosure for those skilled in the art by referring to the specific embodiments.

DETAILED DESCRIPTION

The present disclosure is described in further detail with reference to the enclosed drawings, to clearly present the objects, technical solutions, and advantages of the present disclosure.

In some practices, for improvement of the screen-to-body ratio of the display device, the image sensor of the display panel is placed under a display panel, and a region, directly opposite to the image sensor, of the display panel is made to still display pictures on the premise of having a light-transmissive function.

However, a size of a peripheral region is difficult to reduce due to a pixel drive circuit disposed in a peripheral region of the display panel, and thus a frame of the display panel is large.

Currently, for improvement of the scree-to-body ratio of a display device, a display panel of the display device is designed as a partially light-transmissive display panel. Exemplarily, the following three implementations are employed.

In a first implementation, the display panel includes: a light-transmissive display region and a conventional display region disposed outside the light-transmissive display region. The light-transmissive display region is referred to as a full display with camera (FDC) region. Light-emitting devices are arranged in both the conventional display region and the light-transmissive display region, such that the conventional display region and the light-transmissive display region both display pictures.

A photosensitive sensor of the display panel disposed on a side, opposite to a display surface of the display panel, of the display panel. Because the light-emitting device is not arranged in a portion of sub-pixel region in the conventional display region, a pixel drive circuit in the portion of sub-pixel region is connected to the light-emitting device in the light-transmissive display region to control a picture display of the light-transmissive display region.

However, the light-emitting device in the light-transmissive display region is driven by connecting the pixel drive circuit in the portion of sub-pixel region in the conventional display region to the light-emitting device in the light-transmissive display region, such that a portion of the conventional display region does not display pictures, and thus the display effect of the conventional display region of the display device is poor.

In a second implementation, the display panel includes: a display region and a peripheral region disposed outside the display region. The display region includes a conventional display region and a light-transmissive display region. The conventional display region includes a plurality of pixel drive circuits and a plurality of light-emitting devices, wherein the pixel drive circuits in the conventional display region drive the light-emitting devices in the conventional display region in one-to-one correspondence. The light-transmissive display region includes a plurality of light-emitting devices, and pixel drive circuits corresponding to the light-emitting devices in the light-transmissive display region are disposed in the peripheral region. The pixel drive circuit disposed in the peripheral region drives the light-emitting device in the light-transmissive display region, such that light is prevented from being shielded by the pixel drive circuit, and thus the light-transmissive display region has a light-transmissive function.

However, the frame of the display panel is large due to the pixel drive circuit disposed in the peripheral region, such that the screen-to-body ratio of the display panel is small, and thus the display effect of the display panel is poor.

In a third implementation, the display panel includes a conventional display region and a light-transmissive display region, during a process of manufacturing the display panel, more pixel drive circuits are arranged in the conventional display region by compressing, in a row direction, the pixel drive circuits arranged in arrays in the conventional display region. Excessive pixel drive circuits are electrically connected to the light-emitting devices in the light-transmissive display region to drive the light-emitting devices in the light-transmissive display region.

Referring to FIG. 1, FIG. 1 is a schematic structural diagram of a display panel. Referring to FIG. 1, the display panel includes a substrate 11. The substrate 11 includes a light-transmissive display region 111 and a conventional display region 112 that is non-light-transmissive.

Figure 2:
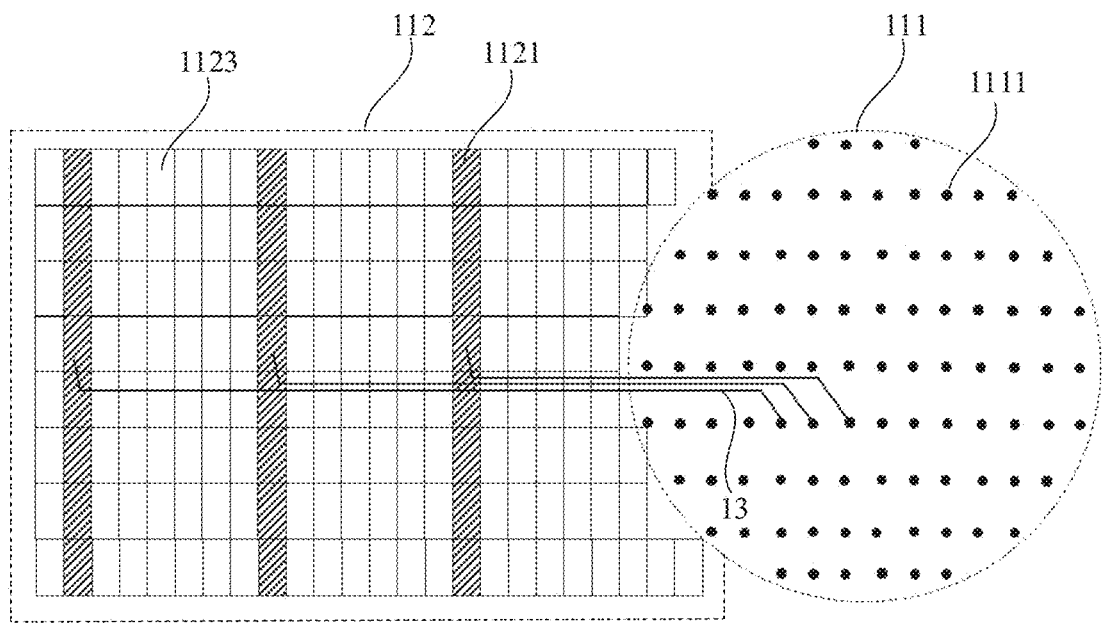
FIG. 2 is a schematic diagram of wiring connections of a light-transmissive display region and a conventional display region of the display panel shown in FIG. 1.

FIG. 2 is a schematic diagram of wiring connections of a light-transmissive display region and a conventional display region of the display panel shown in FIG. 1. Referring to FIG. 2, a second light-emitting device 1111 is arranged in the light-transmissive display region 111, and a second pixel drive circuit 1121 electrically connected to the second light-emitting device 1111 is arranged in the conventional display region 112. Each of the second light-emitting devices 1111 and one of the second pixel drive circuit 1121 form a first pixel unit, wherein the one of the second pixel drive circuits 1121 and the each of the second light-emitting devices 1111 are disposed in the same row and correspondingly electrically connected to each other. The conventional display region 112 includes a plurality of second pixel drive circuits 1121, and further includes a plurality of second pixel units (the second pixel unit includes a first pixel drive circuit 1123 and a first light-emitting device, and the first light-emitting device is not shown in FIG. 2 for clearer display of the pixel drive circuits in the conventional display region). Exemplarily, referring to FIG. 2, a plurality of first pixel drive circuits 1123 are spaced apart between any two second pixel drive circuits 1121 of a row of the second pixel drive circuits 1121.

Figure 3:
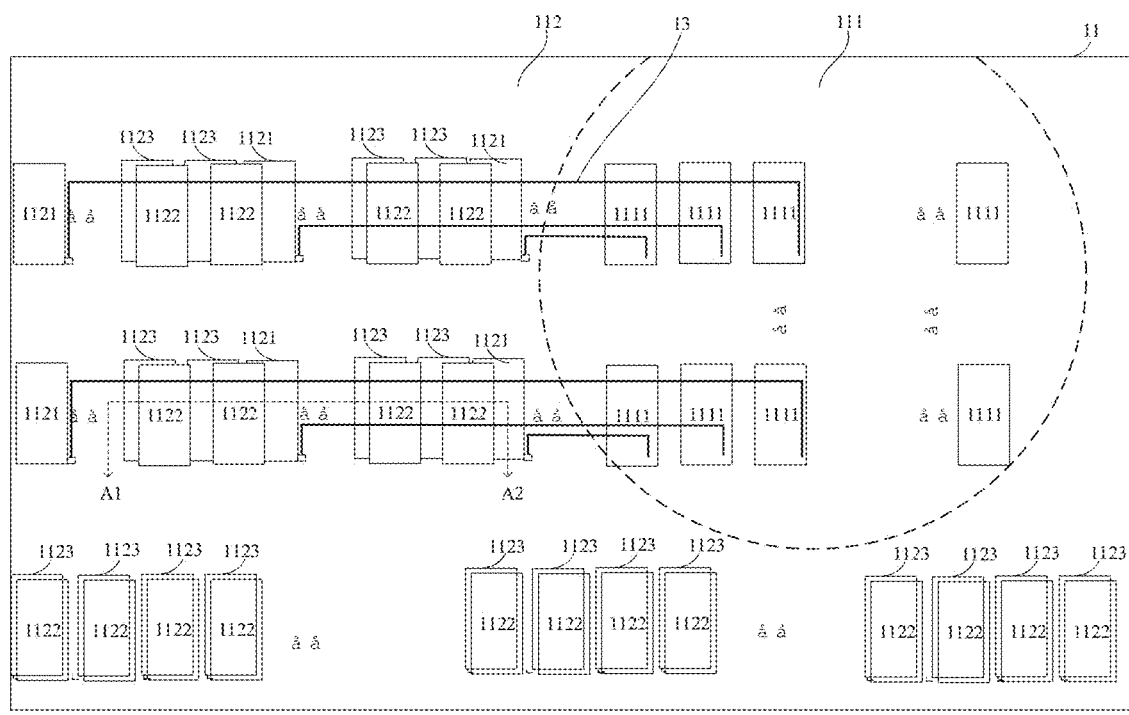
FIG. 3 is a schematic diagram of a partial structure of the display panel shown in FIG. 1.
Figure 4:
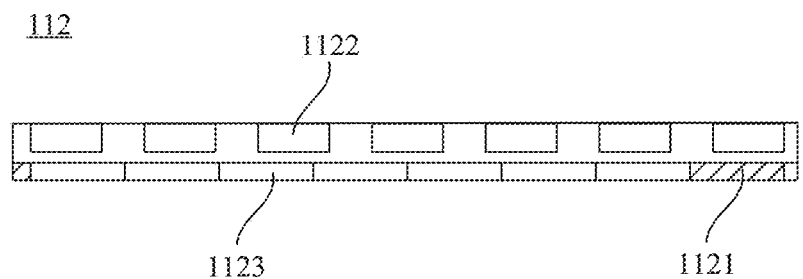
FIG. 4 is a schematic structural diagram of a section along an A1-A2 line of the display panel shown in FIG. 3.

FIG. 3 is a schematic diagram of a partial structure of the display panel shown in FIG. 1. FIG. 4 is a schematic structural diagram of a section along an A1-A2 line of the display panel shown in FIG. 3. Referring to FIG. 3 and FIG. 4, the second pixel unit in the conventional display region 112 includes the first light-emitting device 1122 and the first pixel drive circuit 1123.

It should be noted that, during the process of manufacturing the display panel, reducing a size, in a row direction, of the pixel drive circuit in the conventional display region 112 while maintaining a size, in a column direction, of the pixel drive circuit is equivalent to compressing sizes, in the column direction, of the second pixel drive circuit 1121 and the first pixel drive circuit 1123 without changing a position and a structure of the first light-emitting device 1122. In this way, more columns of the pixel drive circuits are arranged in a unit area of the substrate, and the first light-emitting device 1122 in the conventional display region 112 is connected to a corresponding first pixel drive circuit 1123, such that normal display of a first light-emitting device 1122 disposed at an original position is ensured. In the compressed pixel circuit, a pixel drive circuit not connected to the first light-emitting device 1122 belongs to the second pixel drive circuit 1121, and is electrically connected to the second light-emitting device 11111 of the light-transmissive display region 111 by a connection wiring 13.

Exemplarily, referring to FIG. 2, seven columns of the pixel drive circuits are arranged in space of six original columns of the pixel drive circuits, and an excessive column of the pixel drive circuits is configured to drive the second light-emitting device 1111 of the light-transmissive display region 111. Alternatively, five columns of the pixel drive circuits are arranged in positions where four original columns of the pixel drive circuits are compressed, one of the five columns of the pixel drive circuits is configured to drive the second light-emitting device 1111 of the light-transmissive display region 111. In this arrangement, because two second pixel drive circuits 1123 corresponding to two adjacent second light-emitting devices 1111 in a row of the second light-emitting devices 1111 are spaced apart in the row direction, a length of the connection wiring 13 corresponding to the second light-emitting device 1111 is long. A portion of the connection wiring 13 corresponding to the second light-emitting device of the light-transmissive display region 111 is disposed in the conventional display region 112, and another portion of the connection wiring 13 is disposed in the light-transmissive display region 111. A ratio of a length of the portion of the connection wiring 13 disposed in the conventional display region 112 to a length of the another portion of the connection wiring 13 disposed in the light-transmissive display region 111 is greater than or equal to 7. For example, the light-transmissive display region 111 is circular, and a radius of the light-transmissive display region is 1.5 mm, and then a length of a longest connection wiring 13 corresponding to the second light-emitting device 1111 in the light-transmissive display region 111 is 1.5 mm*(1+7)=12 mm.

In a case that the connection wiring 13 is long, a resistance and a capacitance loaded on the connection wiring are large. In order to make a drive current transmitted by the second pixel drive circuit 1121 drive the second light-emitting device 1111, the connection wiring 13 is required to be charged first, and then the second light-emitting device 1111 is started. In this way, start-up time of the second light-emitting device 1111 in the light-transmissive display region 111 is long, such that a display refresh rate of the display panel is low. A display of the light-transmissive display region 111 at 60 Hz is obviously abnormal, and the display panel fails to support a display at 120 Hz. This issue is particularly severe in a case where the second light-emitting device 1111 has a low grayscale.

Simultaneously, a difference between the lengths of the connection wirings 13 corresponding to two adjacent second light-emitting devices 1111 in a row of the second light-emitting devices 1111 is great, such that a difference between lighting-up time of the two adjacent second light-emitting devices 1111 is great, and thus the display of the light-transmissive display region has poor uniformity.

The embodiments of the present disclosure provide a display panel and a display device, which solve the problems in some practices.

Figure 5:
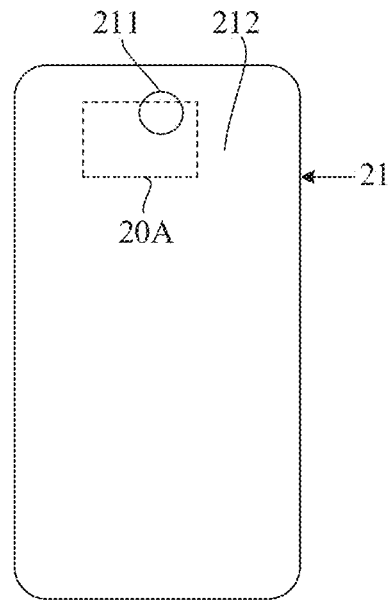
FIG. 5 is a top view of a display panel according to some embodiments of the present disclosure.
Figure 6:
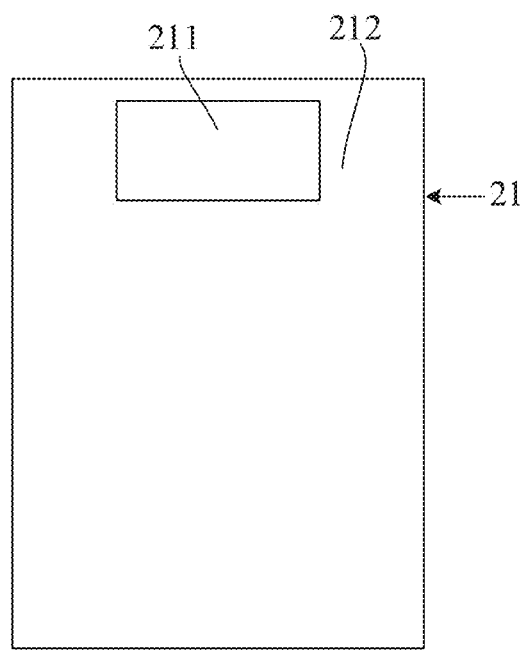
FIG. 6 is a top view of another display panel according to some embodiments of the present disclosure.
Figure 7:
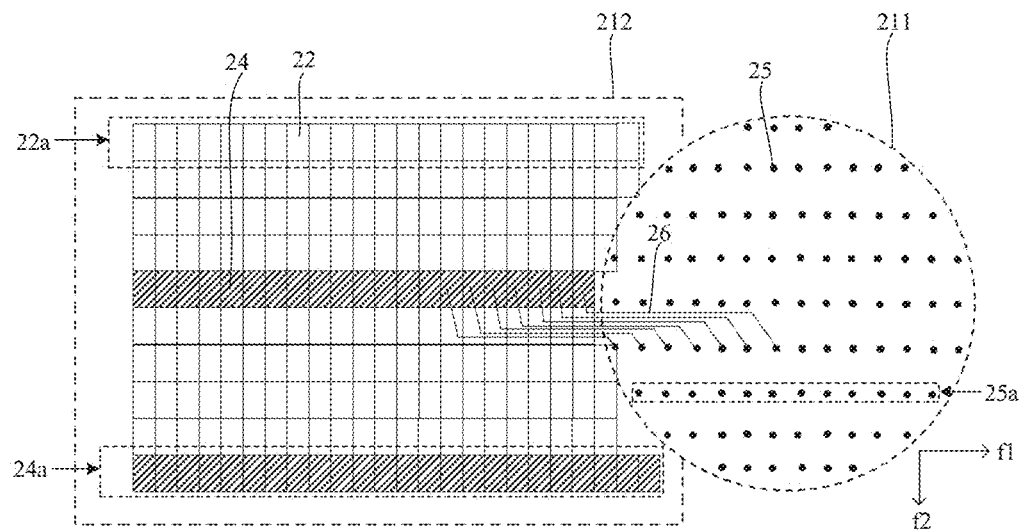
FIG. 7 is a schematic diagram of wiring connections of a light-transmissive display region and a conventional display region of the display panel shown in FIG. 5.
Figure 8:
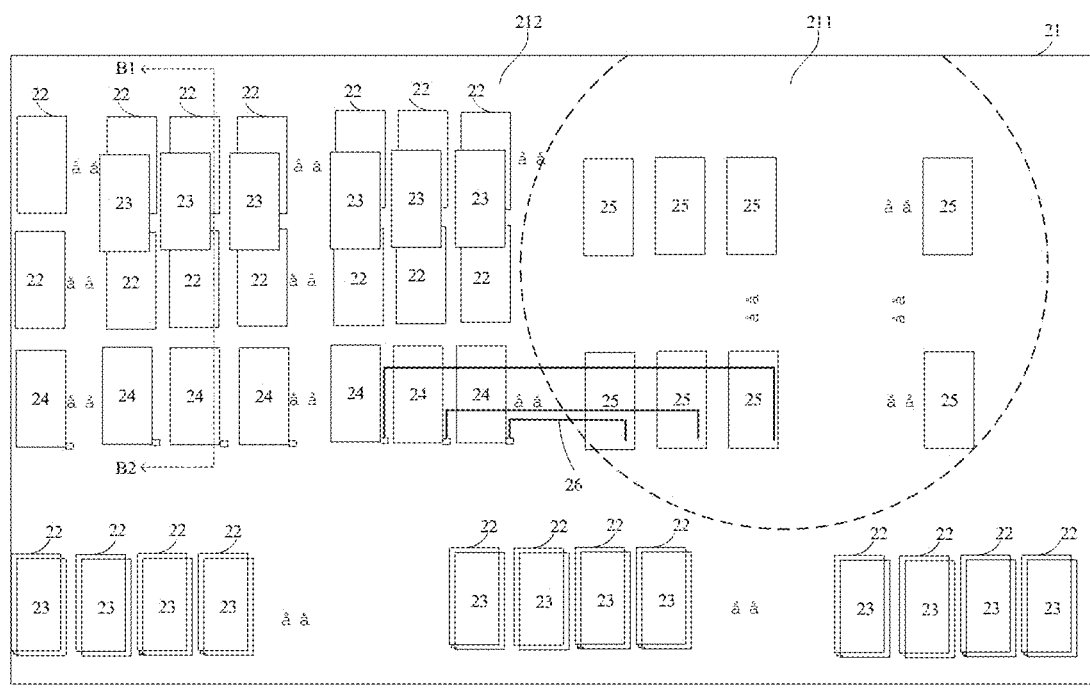
FIG. 8 is a schematic diagram of a partial structure of the display panel shown in FIG. 5.
Figure 9:
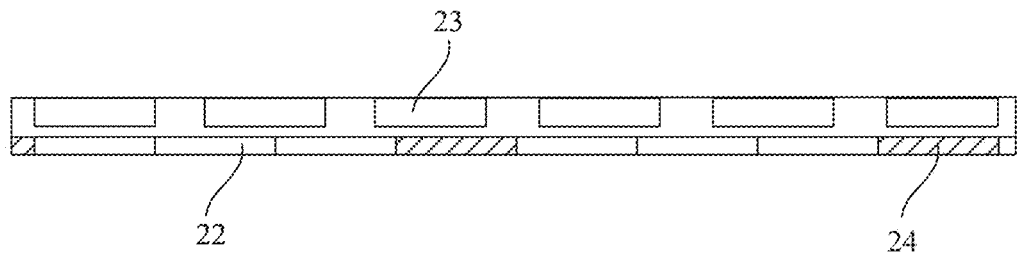
FIG. 9 is a schematic structural diagram of a section along a B1-B2 line of the display panel shown in FIG. 7.

FIG. 5 is a top view of a display panel according to some embodiments of the present disclosure, FIG. 6 is a top view of another display panel according to some embodiments of the present disclosure, FIG. 7 is a schematic diagram of wiring connections of a light-transmissive display region and a conventional display region of the display panel shown in FIG. 5, FIG. 8 is a schematic diagram of a partial structure of the display panel shown in FIG. 5, and FIG. 9 is a schematic structural diagram of a section along a B1-B2 line of the display panel shown in FIG. 7. Referring to FIG. 4, FIG. 5, FIG. 6, FIG. 7, and FIG. 8 together, a display panel includes: a substrate 21, a plurality of first pixel drive circuits 22, a plurality of first light-emitting devices 23, a plurality of second pixel drive circuits 24, and a plurality of second light-emitting devices 25.

The substrate 21 includes a light-transmissive display region 211 and a conventional display region 212 disposed outside the light-transmissive display region 211. Exemplarily, the conventional display region 212 surrounds the light-transmissive display region 211, that is, the light-transmissive display region 211 is surrounded by the conventional display region 212. The light-transmissive display region 211 is disposed at other positions, and the position where the light-transmissive display region 211 is disposed is determined according to actual needs. For example, the light-transmissive display region 211 is disposed at a top center position of the substrate 21, or at a top left corner position or top right corner position of the substrate 21. Hardware such as a photosensitive sensor (e.g., a camera) is disposed in the light-transmissive display region 211 of the display panel. A shape of the light-transmissive display region 211 is a circle as shown in FIG. 5, or a square as shown in FIG. 6, or a hexagon, a trapezoid, or other shapes, which is not limited herein.

Referring to FIG. 7, the plurality of first pixel drive circuits 22 are disposed in the conventional display region 212, and the plurality of first pixel drive circuits 22 include a plurality of groups of first pixel drive circuits 22a. Each group of the plurality of groups of first pixel drive circuits 22a is arranged along a first direction f1, and the plurality of groups of first pixel drive circuits 22a are arranged along a second direction f2. The first direction f1 and the second direction f2 are intersected. The plurality of first light-emitting devices 23 are disposed in the conventional display region 212, and the plurality of first light-emitting devices 23 are electrically connected to the plurality of first pixel drive circuits 22. Orthographic projections of the plurality of first light-emitting devices 23 on the substrate 21 are at least partially overlapped with orthographic projections of the plurality of first pixel drive circuits 22 on the substrate 21 (it should be noted that, the first light-emitting device 23 is not shown in FIG. 7 for a clearer display of an arrangement of the first pixel drive circuits 22 and the second pixel drive circuits 24).

The plurality of second pixel drive circuits 24 are disposed in the conventional display region 212, and the plurality of second pixel drive circuits 24 include a plurality of groups of second pixel drive circuits 24a. Each group of the plurality of groups of second pixel drive circuits 24a is arranged along the first direction f1, and the plurality of groups of second pixel drive circuits 24a are arranged along the second direction f2 and spaced apart between the plurality of groups of first pixel drive circuits 22a.

Referring to FIG. 8, the plurality of first pixel drive circuits 22, the plurality of first light-emitting devices 23, and the plurality of second pixel drive circuits 24 are arranged in the conventional display region 212. The display panel 20 according to some embodiments of the present disclosure is provided with a plurality of rows of pixel drive circuits in the conventional display region 212 by compressing pixel drive circuits. That is, in the conventional display region 212, the number of pixel drive circuits is greater than the number of first light-emitting devices 23. Exemplarily, a unit area of the conventional display region 212 includes M of the first pixel drive circuits 22, N of the second pixel drive circuits 24, and M of the first light-emitting devices 23. M and N are integers, and thus normal display of the conventional display region 212 is ensured.

The plurality of second light-emitting devices 25 are disposed in the light-transmissive display region 211, and the plurality of second light-emitting devices 25 are electrically connected to the plurality of groups of second pixel drive circuits 24a by a conductive wiring 26. In this way, a light transmissivity of the light-transmissive display region 211 is improved. That is, the light-transmissive display region 211 is only provided with the second light-emitting device 25, and the second pixel drive circuit 25 driving the second light-emitting device 25 of the light-transmissive display region 211 is arranged in the conventional display region 212. The light transmissivity of the light-transmissive display region 211 is improved by separately arranging the second light-emitting device 25 and the second pixel drive circuit 24.

It should be noted that, during a process of manufacturing the display panel 20, reducing a size, in the second direction f2 (the second direction f2 is perpendicular to the first direction f1), of the pixel drive circuit in the conventional display region 212 while keeping a size, in the first direction f1, of the pixel drive circuit is equivalent to compressing the pixel drive circuit of the conventional display region 212 along the second direction f2, such that the plurality of rows of pixel drive circuits are added in the unit area of the conventional display region without changing a position and a structure of the first light-emitting device 23. Exemplarily, the pixel drive circuits in the conventional display region 212 are arranged in rows and columns, and then the pixel drive circuits are compressed along a column direction of the pixel drive circuits. In this way, more of the pixel drive circuits are arranged in the unit area of the conventional display region 212, and the first light-emitting device 23 in the conventional display region 212 is connected to a corresponding first pixel drive circuit 22, such that the first light-emitting device 23 disposed at an original position in the conventional display region emits light normally. At least a portion of the excessive plurality of rows of pixel drive circuits after compressing are the second pixel drive circuits 24, which are electrically connected to the second light-emitting devices 25 of the light-transmissive display region 211 by the conductive wiring 26.

In this way, referring to FIG. 7 and FIG. 8, relative to the third implementation in some practices, the plurality of second pixel drive circuits 24 corresponding to the second light-emitting devices 25 of the light-transmissive display region 211 according to some embodiments of the present disclosure are arranged tightly, and proximal to the light-transmissive display region 211, such that an overall length of the conductive wiring 26 corresponding to the second light-emitting device 25 is short, and thus a resistance and a capacitance of the conductive wiring 26 are small, and start-up time of the second light-emitting device 25 of the light-transmissive display region 211 is further reduced. In this way, in a case that the light-transmissive display region 211 displays pictures with a high grayscale, the second light-emitting device 25 responds faster, and the light-transmissive display region 211 is provided with a high display refresh rate, such that the display effect of the light-transmissive display region 211 is bettered.

It should be noted that, for distinguishing the light-transmissive display region 211 and the conventional display region 212, light-emitting devices disposed at a junction of the light-transmissive display region 211 and the conventional display region 212 are not completely shown in FIG. 6. In an actual display panel, the junction of the light-transmissive display region 211 and the conventional display region 212 is provided with a plurality of light-emitting devices, and the plurality of light-emitting devices belong to the light-transmissive display region 211 or the conventional display region 212. In a case that the plurality of light-emitting devices belong to the light-transmissive display region 211, the plurality of light-emitting devices are electrically connected to the plurality of second pixel drive circuits 24; and in a case that the plurality of light-emitting devices belong to the plurality of conventional display region 212, the plurality of light-emitting devices are electrically connected to the plurality of first pixel drive circuits 22.

FIG. 7 and FIG. 8 only show a connection mode of a portion of the plurality of second light-emitting devices 25 electrically connected to one group of the plurality of groups of second pixel drive circuits 24a. The other second light-emitting devices 25 are electrically connected to other second pixel drive circuits 24 in a consistent connection mode with the connection mode.

In some embodiments of the present disclosure, the first light-emitting device 23 and the second light-emitting device 24 are organic light-emitting diode (OLED) light-emitting devices, and at least include: an anode, a light-emitting layer, and a cathode that are arranged in a stacked mode along a direction perpendicular to and away from the substrate 21.

The anode of the second light-emitting device 25 is electrically connected to the second pixel drive circuit 24 by the conductive wiring 26. For further improvement of a light transmittance of the light-transmissive display region 211, the conductive wiring 26 made of a light-transmissive conductive material is employed to connect the second light-emitting device 25 of the light-transmissive display region 211 to the second pixel drive circuit 24 of the conventional display region 212. The light-transmissive conductive material is made of indium tin oxide (ITO).

In summary, the embodiments of the present disclosure provide a display panel, including the substrate, the plurality of rows of first light-emitting devices, the plurality of rows of first pixel drive circuits, and the plurality of rows of second pixel drive circuits that are disposed within the conventional display region of the substrate, and the plurality of rows of second light-emitting devices disposed within the light-transmissive display region of the substrate. The first pixel drive circuit is electrically connected to the first light-emitting device, and the second pixel drive circuit is electrically connected to the second light-emitting device. That is, the pixel drive circuit of the second light-emitting device within the light-transmissive display region is disposed in the conventional display region. In this way, the pixel drive circuit is not required to be arranged in a peripheral region, such that a size of the peripheral region is reduced, and thus the problem of the large frame of the display panel in some practices is solved, and an effect of reducing a frame of the display panel is achieved.

In addition, in the embodiments of the present disclosure, a length of the conductive wiring connecting the second light-emitting device to the second pixel drive circuit is short, such that the second light-emitting device of the light-transmissive display region responds fast, and thus a display refresh rate of the display panel is improved. Meanwhile, the display effect of the light-transmissive display region in displaying low grayscale pictures is improved, and thus the entire display effect of the light-transmissive display region is further improved.

Optionally, referring to FIG. 7, the plurality of second light-emitting devices 25 include a plurality of groups of second light-emitting devices 25a. Each group of the plurality of groups of second light-emitting devices 25a is arranged along the first direction f1, and the plurality of groups of second light-emitting devices 25a are arranged along the second direction f2. At least one group of second pixel drive circuits 24a in the plurality of groups of second pixel drive circuits 24a is electrically connected to at least one group of second light-emitting devices 25a in the plurality of groups of second light-emitting devices 25a. That is, the at least one group of second pixel circuits 24a is correspondingly electrically connected to the at least one group of second light-emitting devices 25a. A plurality of second pixel drive circuits 24 in a group of second pixel drive circuits 24a are electrically connected to a plurality of second light-emitting devices 25 in a group of second light-emitting devices 25a in one-to-one correspondence; and a plurality of second pixel drive circuits 24 in a group of second pixel drive circuits 24a are electrically connected to a plurality of second d light-emitting devices 25 in the plurality of groups of second light-emitting devices 25a in one-to-one correspondence.

It should be noted that, a corresponding relationship in the above "correspondingly electrically connected" and "in one-to-one correspondence" indicates that a group of second pixel drive circuits 24a corresponds to at least one group of second light-emitting device 25a, and any second light-emitting device 25 in the at least one group of second light-emitting device 25a corresponds to a second pixel drive circuit 24 in the corresponding group of second pixel drive circuits 24a. The second light-emitting device 25 is electrically connected to the corresponding second pixel drive circuit 24, and the number of second pixel drive circuits 24 is greater than or equal to the number of second light-emitting devices 25. In this way, each of the second light-emitting devices 25 emits light driven by the corresponding second pixel drive circuit 24.

Alternatively, the number of second light-emitting devices 25 is greater than or equal to the number of second pixel drive circuits 24. In this way, one of the second pixel drive circuits 24 is correspondingly connected to a plurality of second light-emitting devices 25.

Optionally, referring to FIG. 7, an arrangement direction of the at least one group of second pixel drive circuits 24a and an arrangement direction of the corresponding at least one group of the second light-emitting devices 25a are parallel to the first direction f1, and the at least one group of second pixel drive circuits 24a is disposed on at least one side, in the first direction f1, of the corresponding at least one group of second light-emitting devices 25a.

That is, the arrangement direction of the at least one group of second pixel drive circuits 24a is parallel to the arrangement direction of the corresponding at least one group of second light-emitting devices 25a. The parallelism indicates that the arrangement direction of the at least one group of second pixel drive circuits 24a is parallel to the arrangement direction of the corresponding at least one group of second light-emitting devices 25a within a certain deviation range.

Figure 10:
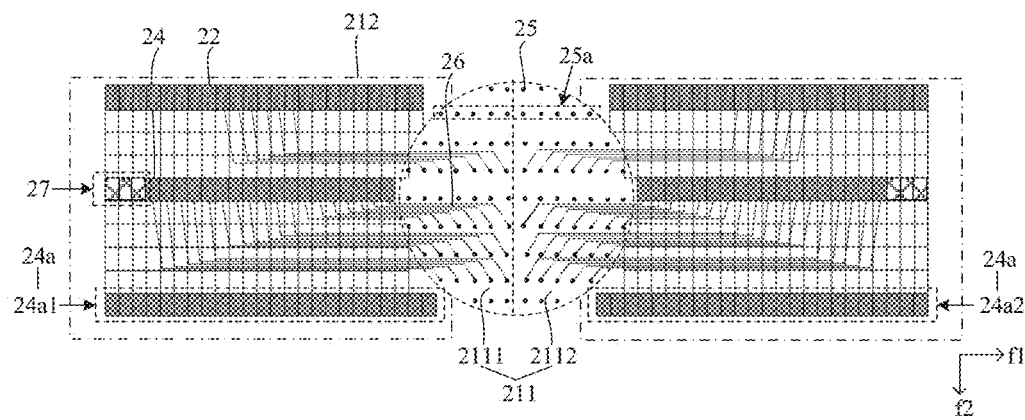
FIG. 10 is a schematic diagram of wiring connections of a light-transmissive display region and a conventional display region of still another display panel according to some embodiments of the present disclosure.

Optionally, FIG. 10 is a schematic diagram of wiring connections of a light-transmissive display region and a conventional display region of still another display panel according to some embodiments of the present disclosure. Referring to FIG. 10, the at least one group of second pixel drive circuits 24a is disposed on both sides, in the first direction f1, of the corresponding at least one group of second light-emitting devices 25a.

In this way, the length of the conductive wiring 26 between the second light-emitting device 25 and the second pixel drive circuit 24 is further shortened, and thus the display effect of the light-transmissive display region 211 is great.

Optionally, referring to FIG. 10, the at least one group of second pixel drive circuits 24a in the plurality of groups of second pixel drive circuits 24a includes a first sub-pixel drive circuit group 24a1 and a second sub-pixel drive circuit group 24a2. The first sub-pixel drive circuit group 24a1 and the second sub-pixel drive circuit group 24a2 are symmetrically arranged with respect to the light-transmissive display region 211. In this way, a difference between the lengths of the conductive wirings 26 connected to the first sub-pixel drive circuit group 24a1 and the second sub-pixel drive circuit group 24a2 is small, and thus the display effect of the light-transmissive display region 211 is uniform.

Figure 11:
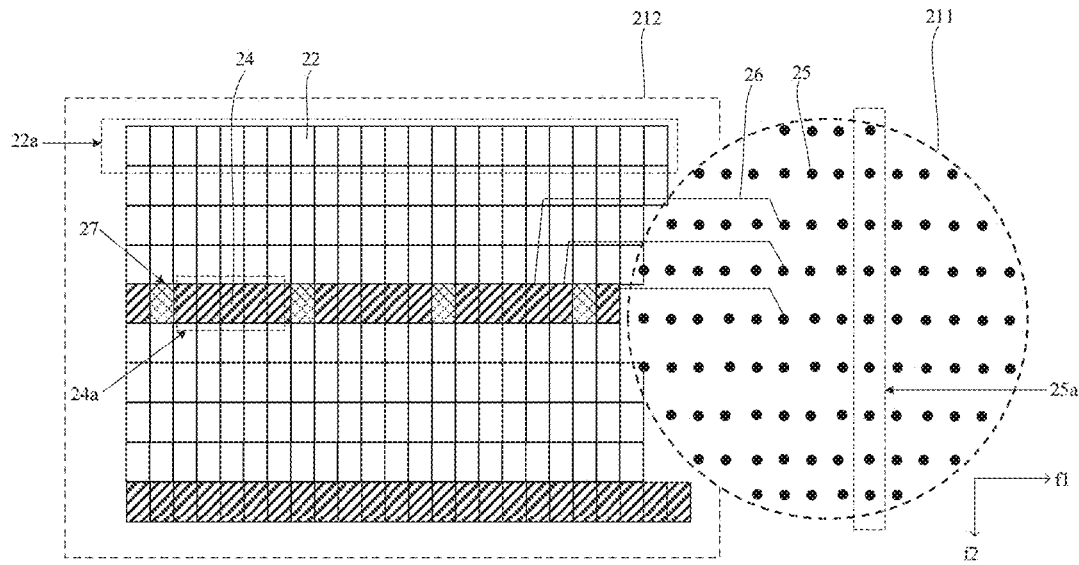
FIG. 11 is a schematic diagram of wiring connections of a light-transmissive display region and a conventional display region of still another display panel according to some embodiments of the present disclosure.
Figure 12:
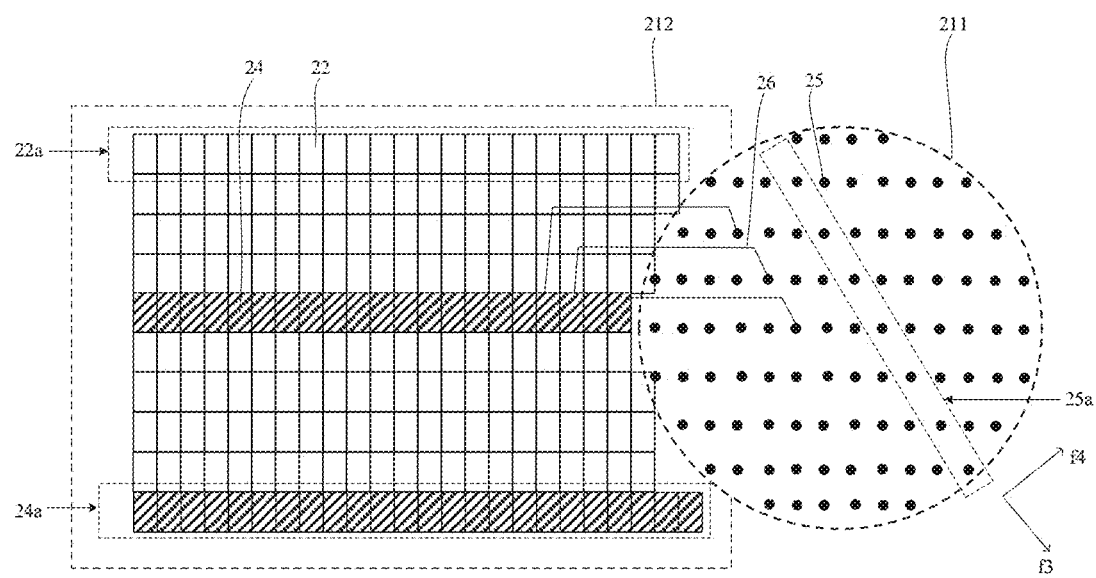
FIG. 12 is a schematic diagram of wiring connections of a light-transmissive display region and a conventional display region of still another display panel according to some embodiments of the present disclosure.

Optionally, FIG. 11 is a schematic diagram of wiring connections of a light-transmissive display region and a conventional display region of still another display panel according to some embodiments of the present disclosure, and FIG. 12 is a schematic diagram of wiring connections of a light-transmissive display region and a conventional display region of still another display panel according to some embodiments of the present disclosure. Referring to FIG. 11 and FIG. 12, the plurality of second light-emitting devices 25 include a plurality of groups of second light-emitting devices 25a. Each group of second light-emitting devices 25a in the plurality of groups of second light-emitting devices 25a is arranged along the second direction f2, and the plurality of groups of second light-emitting devices 25a are arranged along the first direction f1. At least one group of second pixel drive circuits 24a in the plurality of groups of second pixel drive circuits 24a is electrically connected to at least one group of second light-emitting device 25a in the plurality of second light-emitting devices 25a. Alternatively, the plurality of second light-emitting devices 25 include a plurality of groups of second light-emitting devices 25a. Each group of second light-emitting devices 25a in the plurality of groups of second light-emitting devices 25a is arranged along a third direction f3, and the plurality of groups of second light-emitting devices 25a are arranged along a fourth direction f4. The first direction f1, the second direction f2, the third direction f3, and the fourth direction f4 are not consistent. That is, the plurality of groups of second light-emitting devices 25a are flexibly arranged in the light-transmissive display region 211.

Figure 13:
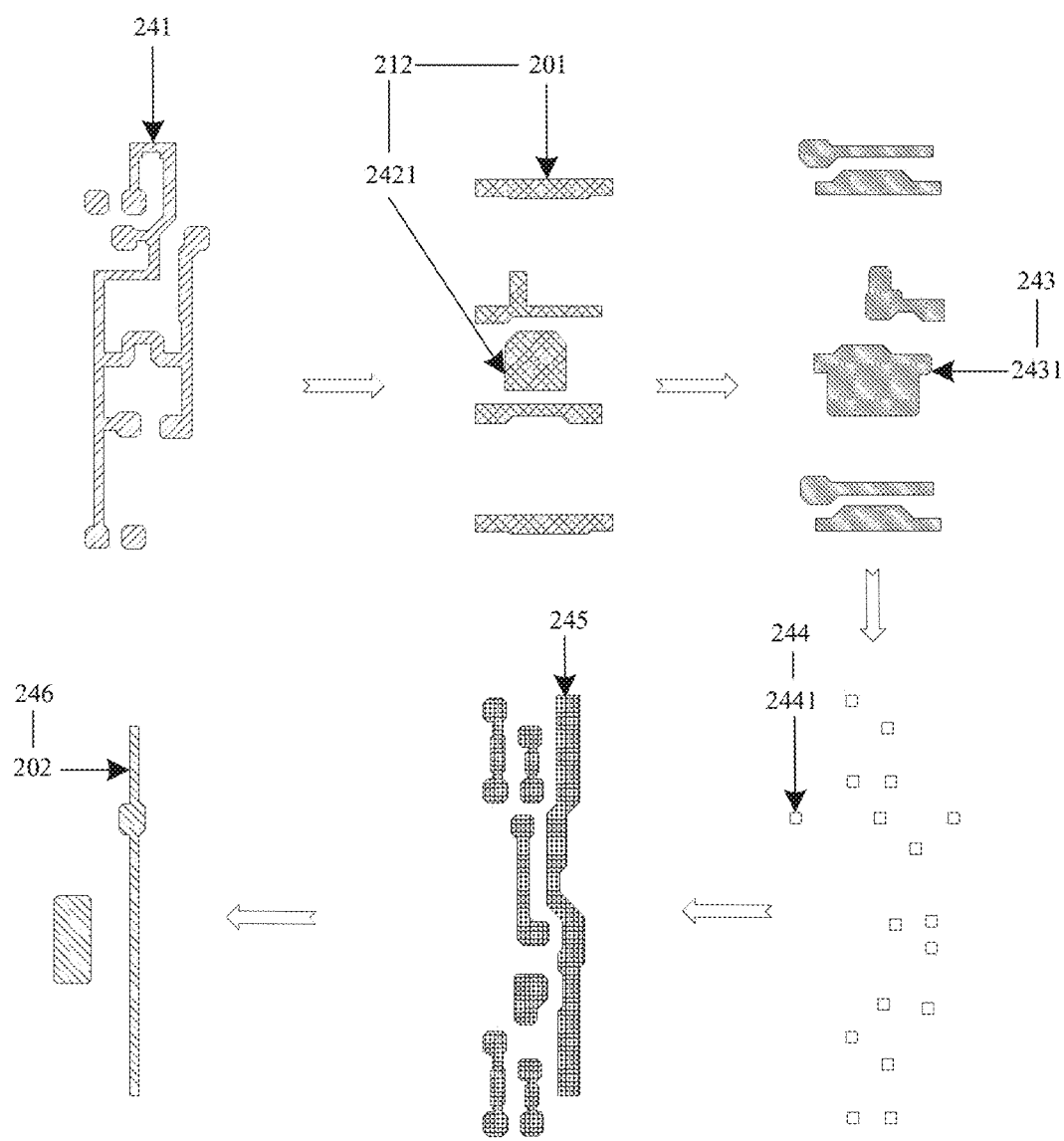
FIG. 13 is a schematic structural diagram of each film layer of a second pixel drive circuit according to some embodiments of the present disclosure.
Figure 14:
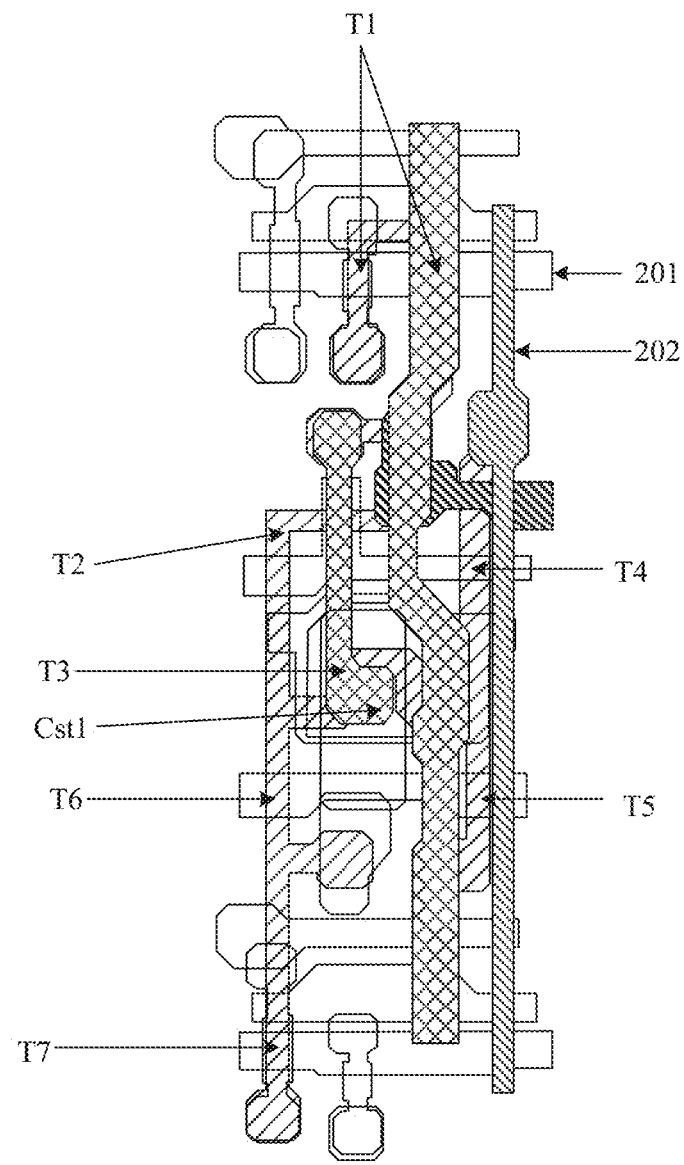
FIG. 14 is a schematic structural diagram of a second pixel drive circuit according to some embodiments of the present disclosure.
Figure 15:
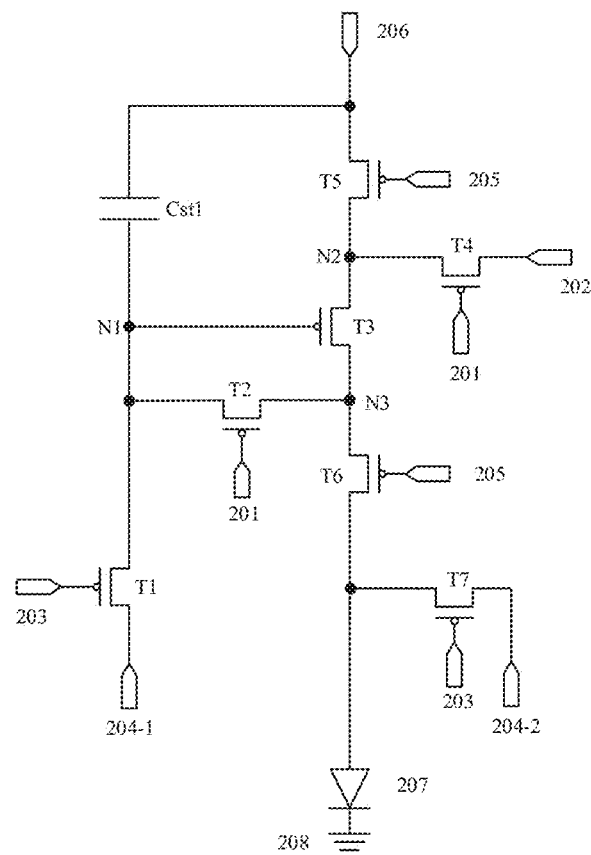
FIG. 15 is a circuit schematic diagram of a second pixel drive circuit according to some embodiments of the present disclosure.

Referring to FIG. 14, FIG. 14, and FIG. 15 together. FIG. 13 is a schematic structural diagram of each film layer of a second pixel drive circuit according to some embodiments of the present disclosure. In an exemplary implementation, referring to FIG. 13, the second pixel drive circuit includes an active layer pattern 241, a first conductive pattern 212, a second conductive pattern 243, a medium layer 244, a third conductive pattern 245, and a fourth conductive pattern 246. The first conductive pattern 242 includes a first polar plate 2421 of a capacitor structure, a gate line 201, and a gate electrode. The second conductive pattern 243 includes a second polar plate 2131 of the capacitor structure. The medium layer 244 is provided with a via 2441. The third conductive pattern 245 includes a power supply line, a source electrode, and a drain electrode. The fourth conductive pattern 246 includes a data signal line 202.

FIG. 14 is a schematic structural diagram of a second pixel drive circuit according to some embodiments of the present disclosure. Referring to FIG. 14, in an optional implementation, the second pixel drive circuit includes a first thin-film transistor T1, a second thin-film transistor T2, a third thin-film transistor T3, a fourth thin-film transistor T4, a fifth thin-film transistor T5, a sixth thin-film transistor T6, a seventh thin-film transistor T7, and the capacitor structure Cst1.

The first thin-film transistor T1 is a first initial thin-film transistor, the second thin-film transistor T2 is a compensation thin-film transistor, the third thin-film transistor T3 is a drive thin-film transistor, the fourth thin-film transistor T4 is a data writing thin-film transistor, the fifth thin-film transistor T5 is an operation control thin-film transistor, the sixth thin-film transistor T6 is an emission control thin-film transistor, and the seventh thin-film transistor T7 is a second initial thin-film transistor. It should be noted that, the thin-film transistors T1 to T7 include a low temperature poly-silicon (LTPS) thin-film transistor and/or oxide thin-film transistor (O-TFT). In some embodiments, the thin-film transistors T1 to T7 are other types of thin-film transistors, which are not limited herein.

FIG. 15 is a circuit schematic diagram of a second pixel drive circuit according to some embodiments of the present disclosure. Referring to FIG. 15, a gate electrode of the third thin-film transistor T3 is connected to a first node N1, a source electrode of the third thin-film transistor T3 is connected to a second node N2, and a drain electrode of the third thin-film transistor T3 is connected to a third node N3.

A gate electrode of the fourth thin-film transistor T4 is connected to the gate line (Gate) 201, a source electrode of the fourth thin-film transistor T4 is connected to the data signal line (Data) 202, and a drain electrode of the fourth thin-film transistor T4 is connected to the second node N2.

A gate electrode of the second thin-film transistor T2 is connected to the gate line 201, a source electrode of the second thin-film transistor T2 is connected to the third node N3, and a drain electrode of the second thin-film transistor T2 is connected to the first node N1.

A gate electrode of the first thin-film transistor T1 is connected to a reset signal line (Reset) 203, a drain electrode of the first thin-film transistor T1 is connected to a first reference signal line (Vinit) 204-1, and a source electrode of the first thin-film transistor T1 is connected to the first node N1.

A gate electrode of the fifth thin-film transistor T5 and a gate electrode of the sixth thin-film transistor T6 are connected to a light-emitting signal line (EM) 205, a source electrode of the fifth thin-film transistor T5 is connected to a constant-voltage high potential (VDD) 206, a drain electrode of the fifth thin-film transistor T5 is connected to the second node N2, a source electrode of the sixth thin-film transistor T6 is connected to the third node N3, a drain electrode of the sixth thin-film transistor T6 is connected to an anode of a light-emitting device (OLED) 207, and a cathode of the light-emitting device 207 is connected to a low potential (VSS) 208.

A gate electrode of the seventh thin-film transistor T7 is connected to the gate line 201, a drain electrode of the seventh thin-film transistor T7 is connected to a second reference signal line 204-1, and a source electrode of the seventh thin-film transistor T7 is connected to the anode of the light-emitting device 207.

One terminal of the capacitor structure Cst1 is connected to the first node N1, and the other terminal of the capacitor structure Cst1 is connected to the constant-voltage high potential 206.

Voltage values of the first reference signal line 204-1 and the second reference signal line 204-2 are different. Exemplarily, the voltage values of the first reference signal line 204-1 and the second reference signal line 204-2 differ by 1V to 5V.

Alternatively, the first reference signal line 204-1 and the second reference signal line 204-2 are connected to a same signal input terminal.

It should be noted that, in the present disclosure, in a case that a transistor with opposite polarities is used or a direction of a current changes during a circuit operation, functions of the "source electrode" and the "drain electrode" are occasionally interchanged. Therefore, in the present disclosure, the "source electrode" and the "drain electrode" are interchangeable, which is not limited herein.

The compensation thin-film transistor T2 is electrically connected to a gate drive terminal, the first node N1, and the third node N3. The compensation thin-film transistor T2 is configured to adjust potentials of the first node N1 and the third node N2, in response to a gate drive signal. The gate drive terminal is configured to provide the gate drive signal.

The first node N1 is connected to the gate electrode of the third thin-film transistor T3, the drain electrode of the second thin-film transistor T2, the drain electrode of the first thin-film transistor T1, and one terminal of a storage capacitor C1. Therefore, the potential of the first node N1 is prone to be affected by other structures in the drive circuit, such that a stability of the potential of the first node N1 is poor.

Optionally, referring to FIG. 10, the display panel further includes a plurality of groups of virtual pixel drive circuits 27 disposed in the conventional display region 212. At least one group of virtual pixel drive circuits 27 is arranged along the first direction f1 and is disposed on a side, distal from the light-transmissive display region 211, of the at least one group of second pixel drive circuits 24a.

A structure of the virtual pixel drive circuit 27 is similar to the second pixel drive circuit. The virtual pixel drive circuit does not include the via of the medium layer, such that the virtual pixel drive circuit 27 is not connected to the first light-emitting device 23 and the second light-emitting device 25 of the display panel 20.

Optionally, referring to FIG. 11, the plurality of groups of virtual pixel drive circuits 27 are spaced apart between the plurality of groups of second pixel drive circuits 24a, or disposed between the plurality of groups of second pixel drive circuits 24a and the light-transmissive display region 211.

Optionally, referring to FIG. 10, the light-transmissive display region 211 includes two light-transmissive sub-regions (a first light-transmissive sub-region 2111 and a second light-transmissive sub-region 2112) arranged along the first direction f1. The second light-emitting device 25 disposed in any light-transmissive sub-region of the two light-transmissive sub-regions (the first light-transmissive sub-region 2111 and the second light-transmissive sub-region 2112) is correspondingly electrically connected to the second pixel drive circuit 24 disposed on a first side of the any light-transmissive sub-region. The first side is a side, distal from another light-transmissive sub-region of the two light-transmissive sub-regions (the first light-transmissive sub-region 2111 and the second light-transmissive sub-region 2112), of the any light-transmissive sub-region.

The second light-emitting device 25 disposed in the any light-transmissive sub-region (the first light-transmissive sub-region 2111 or the second light-transmissive sub-region 2112) of the two light-transmissive sub-regions (the first light-transmissive sub-region 2111 and the second light-transmissive sub-region 2112) is correspondingly electrically connected to the second pixel drive circuit 24 disposed on the first side of the any light-transmissive sub-region (the first light-transmissive sub-region 2111 or the second light-transmissive sub-region 2112). The first side is the side, distal from the another light-transmissive sub-region (the first light-transmissive sub-region 2111 or the second light-transmissive sub-region 2112) of the two light-transmissive sub-regions (the first light-transmissive sub-region 2111 and the second light-transmissive sub-region 2112), of the any light-transmissive sub-region (the first light-transmissive sub-region 2111 or the second light-transmissive sub-region 2112). Exemplarily, the second light-transmissive sub-region 2112 is disposed on a right side of the first light-transmissive sub-region 2111, and the second light-emitting device 25 in the first light-transmissive sub-region 2111 is electrically connected to the second pixel drive circuit 24 disposed on a left side of the first light-transmissive sub-region 2111.

Optionally, areas of the two light-transmissive sub-regions (the first light-transmissive sub-region 2111 and the second light-transmissive sub-region 2112) are equal, such that the numbers of second light-emitting devices 25 in the two light-transmissive sub-regions (the first light-transmissive sub-region 2111 and the second light-transmissive sub-region 2112) are basically consistent. In this way, a difference between lengths of the conductive wirings 26 corresponding to the second light-emitting devices 25 in the two light-transmissive sub-regions (the first light-transmissive sub-region 2111 and the second light-transmissive sub-region 2112) is small, such that the brightness of the second light-emitting device 25 of the light-transmissive display region 211 is uniform, and thus the display effect of the light-transmissive display region 211 is improved.

Optionally, the at least one group of second pixel drive circuits 24a in the plurality of groups of second pixel drive circuits 24a is adjacent to the light-transmissive display region 211. In this way, a distance between the second light-emitting device 25 and the second pixel drive circuit 24 is small, such that the length of the conductive wiring 26 between the second light-emitting device 25 and the second pixel drive circuit 24 is further shortened, and thus the display effect of the light-transmissive display region 211 is bettered.

Optionally, the plurality of second pixel drive circuits 24 corresponding to the one group of second light-emitting devices 25a are successively arranged in the first direction. It should be understood that, each of the plurality of second pixel drive circuits 24 corresponding to the one group of second light-emitting devices 25a is electrically connected to the conductive wiring 26, and the plurality of second pixel drive circuits 24 does not include other pixel circuits not electrically connected to the conductive wiring 26.

That is, two of the plurality of second pixel drive circuits 24 corresponding to two adjacent second light-emitting devices 25 in the one group of second light-emitting devices 25a are adjacently arranged. In this way, a difference between lengths of the conductive wirings 26 corresponding to adjacent second light-emitting devices 25 in each of the light-transmissive sub-regions (2111 or 2112) is small, such that start-up time of the adjacent second light-emitting devices 25 is closer, which improves a display uniformity of the light-transmissive display region 211.

Optionally, a ratio of the number of first pixel drive circuits 22 in the second direction f2 to the number of second pixel drive circuits 24 in the second direction f2 is greater than 1. In the embodiments of the present disclosure, more second pixel drive circuits are arranged in a unit area of the substrate. Based on this, the length of the conductive wiring is further reduced.

Optionally, the one group of second pixel drive circuits is correspondingly electrically connected to three to right groups of second light-emitting devices 25a.

That is, during the process of manufacturing the display panel, the ratio of the number of first pixel drive circuits in the second direction f2 to the number of second pixel drive circuits in the second direction f2 is greater than or equal to 3 and less than or equal to 8. Compared with some practices, due to a short distance between adjacent second pixel drive circuits 24 in the one group of second pixel drive circuits 24a, the one group of second pixel drive circuits 24a is correspondingly electrically connected to the three to eight groups of second light-emitting devices 25a without growing an overall length of the conductive wiring 26 between the second pixel drive circuit 24 and the second light-emitting device 25. In this way, relative to the ratio of the number of first pixel drive circuits 22 in the second direction to the number of second pixel drive circuits 24 in the second direction is 1, a difference between a size of the compressed pixel drive circuit and a size of the pre-compressed pixel drive circuit is small, such that the difficulty in manufacturing the display panel is reduced.

In the embodiments of the present disclosure, the compression for the pixel drive circuit of the conventional display region includes two compression modes: a limited compression mode or an overall compression mode. The limited compression mode indicates that only pixels drive circuit in a region involved, in the first direction, in the light-transmissive display region are compressed. Exemplarily, prior to compressing, the region involved, in the first direction, in the light-transmissive display region includes 48 rows of pixel drive circuits, 12 excessive rows of pixel drive circuits are available upon compressing the pixel drive circuits. The limited compression mode allows pixel drive circuits in an uncompressed region of the display panel to be unaffected, and thus an influence on the display effect of the display panel is reduced as much as possible.

The overall compression mode indicates that all the pixel drive circuits of the display panel are compressed. In this way, the sizes of the pixel drive circuits of the display panel are equal, and thus the difficulty in manufacturing the display panel is reduced.

Figure 16:
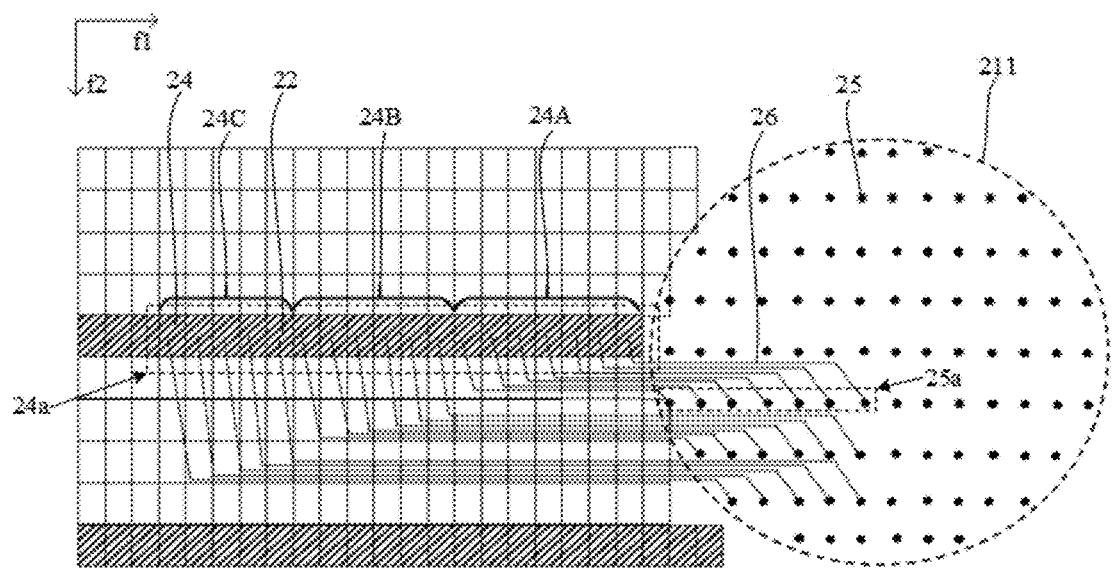
FIG. 16 is a schematic diagram of wiring connections of a light-transmissive display region and a conventional display region of still another display panel according to some embodiments of the present disclosure.

FIG. 16 is a schematic diagram of wiring connections of a light-transmissive display region and a conventional display region of still another display panel according to some embodiments of the present disclosure. Referring to FIG. 16, the plurality of groups of second pixel drive circuits 24a include a target group of second pixel drive circuits 24a, and the target group of second pixel drive circuits 24a is correspondingly electrically connected to at least two groups of second light-emitting devices 25a; and the second pixel drive circuits 24 corresponding to the at least two groups of second light-emitting devices 25a are successively arranged in the first direction f1. The target group of second pixel drive circuits 24a refers to any group of the plurality of groups of second pixel drive circuits 24a in the conventional display region. That is, the target group of second pixel drive circuits 24a includes at least two sub-groups of second pixel drive circuits. Description is given in FIG. 16 using a scenario where the target group of second pixel drive circuits 24a includes: a first group of second pixel drive circuits 24A, a second group of second pixel drive circuits 24B, and a third group of second pixel drive circuits 24C, that is, three sub-groups of second pixel drive circuits, as an example. In some embodiments, the target group of second pixel drive circuits 24a includes 4, 5, or more sub-groups of second pixel drive circuits, which is not limited herein. Each of the sub-groups of second pixel drive circuits (24A, 24B, or 24C) corresponds to a group of second light-emitting devices 25a, and the at least two sub-groups of second pixel drive circuits (24A, 24B, and 24C) are successively arranged in the first direction f1. In this way, length differences between the conductive wirings 26 of different groups of second light-emitting devices 25 are reduced, and thus the display uniformity of the light-transmissive display region 211 is improved.

Optionally, in the second direction f2, a distance between any group of second light-emitting devices 25a in the at least two groups of second light-emitting devices 25a and the target group of second pixel drive circuits 24a is positively correlated with a first length. The first length is a length of the conductive wiring 26 between the second light-emitting device 25 in the any group of second light-emitting devices 25a and the target group of second pixel drive circuits 24a.

The longer the distance between a group of second light-emitting devices 25a in the second direction f2 and the target group of second pixel drive circuits 24a, the longer a length of the conductive wiring 26 between the second light-emitting device 25 in the group of second light-emitting devices 25a and the target group of second pixel drive circuits 24a. In this way, in one aspect, the conductive wirings 26 are prevented from being intersected with each other; and in another aspect, it is convenient to arrange a plurality of conductive wirings 26 corresponding to the plurality of groups of second light-emitting devices 25a on the substrate, such that routing of the plurality of conductive wirings 26 on the substrate is regular.

Figure 17:
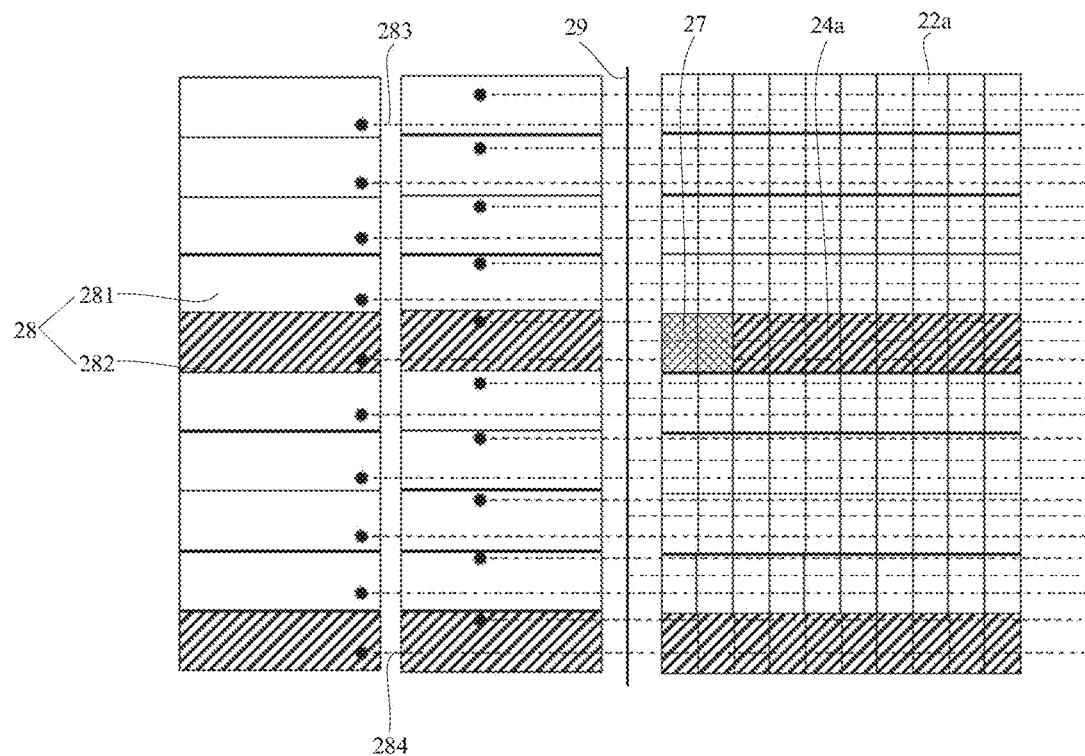
FIG. 17 is a schematic structural diagram of a drive circuit of a display panel according to some embodiments of the present disclosure.

Optionally, FIG. 17 is a schematic structural diagram of a drive circuit of a display panel according to some embodiments of the present disclosure. Referring to FIG. 17, the display panel further includes a gate drive circuit 28 disposed on the substrate. The gate drive circuit 28 includes a plurality of first gate drive units 281 correspondingly electrically connected to the plurality of groups of first pixel drive circuits 22a, and a plurality of second gate drive units 282 correspondingly electrically connected to the plurality of groups of second pixel drive circuits 24a.

Exemplarily, relative to the uncompressed display panel with no second gate drive unit 282 arranged, a scan resolution of the display panel is 1224*2700. In the case that 24 excessive groups of second pixel drive circuits are available upon compression of the display panel, 24 excessive second gate drive units 282 are accordingly arranged, and then the scan resolution of the display panel is 1224*2724. Outputs of a corresponding control signal (CB) and a corresponding time sequence signal (CK) are adjusted by a drive chip (IC) of the display device.

Figure 18:
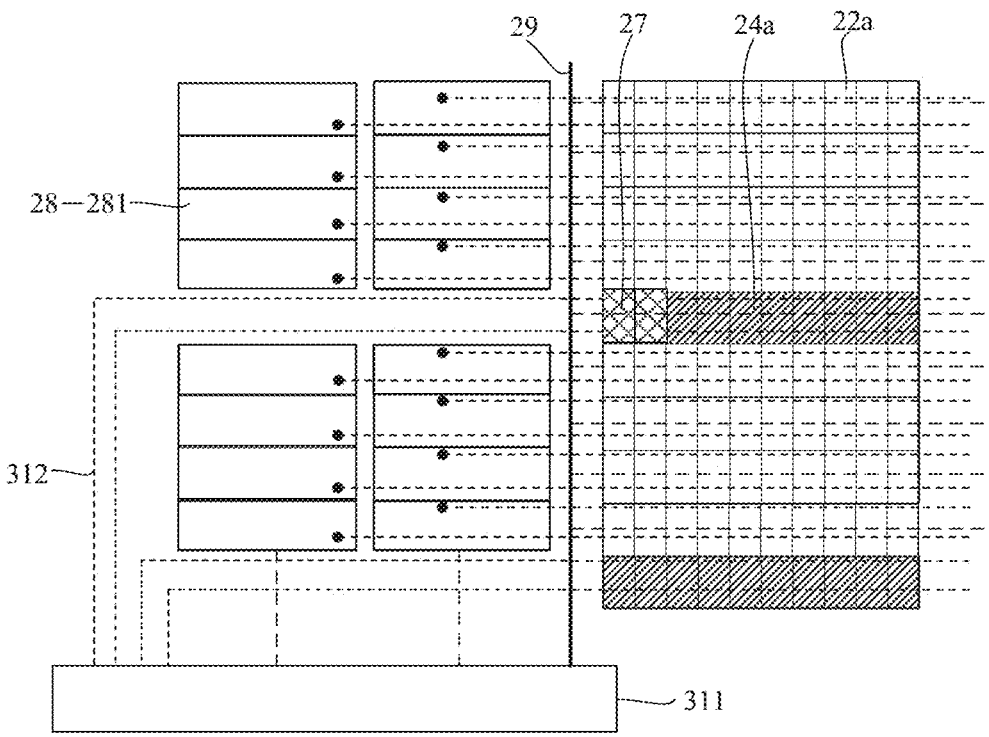
FIG. 18 is a schematic structural diagram of a drive circuit of another display panel according to some embodiments of the present disclosure.

Optionally, FIG. 18 is a schematic structural diagram of a drive circuit of another display panel according to some embodiments of the present disclosure. Referring to FIG. 18, the display panel further includes a gate drive circuit 28 disposed on the substrate and an independent signal wiring 312 correspondingly electrically connected to the plurality of groups of second pixel drive circuits 24a. The gate drive circuit 28 includes a plurality of first gate drive circuits 281 correspondingly electrically connected to the plurality of groups of first pixel drive circuits 22a.

The plurality of groups of second pixel drive circuits 24a are configured to be electrically connected to a drive chip 311 by the independent signal wiring 312. That is, EM and Gate signals of the plurality of groups of second pixel drive circuits 24a are driven in an independent drive mode.

Optionally, the plurality of second gate drive units 282 are electrically connected to the plurality of groups of second pixel drive circuits 24a by a first connection wiring 283. At least one group of virtual pixel drive circuits 27 in the plurality of groups of virtual pixel drive circuits 27 is disposed between the gate drive circuit 28 and at least one group of second pixel drive circuits 24a.

Optionally, the display panel includes an initialization power supply bus (Vinit) 29 disposed on the substrate 21. The initialization power supply bus 29 is disposed between the gate drive circuit 28 and the virtual pixel drive circuit 27, and is connected to the second pixel drive circuit by a second connection wiring.

The display panel further includes at least one of a reset control line (RST) and an enable signal line (EM). Arrangements of the reset control line (RST) and the enable signal line (EM) are consistent with an arrangement of the gate drive circuit 28.

The display panel includes a data line (Data) and a power supply signal line (VDD). The data line (Data) and the power supply signal line (VDD) arranged along the first direction.

Optionally, an arrangement density of the plurality of first light-emitting devices 23 in the conventional display region 212 is equal to an arrangement density of the plurality of second light-emitting devices 25 in the light-transmissive display region 211. In this way, the display effect of the conventional display region 212 is close to the display effect of the light-transmissive display region 211, such that the display uniformity of the display panel is improved. A first area of an orthographic projection of the first light-emitting device 23 of the conventional display region 212 on the substrate 21 is greater than a second area of an orthographic projection of the second light-emitting device 25 of the light-transmissive display region 211 on the substrate 21. Exemplarily, a ratio of the first area to the second area is 2. In this way, the light transmittance of the light-transmissive display region 211 is great.

In summary, the embodiments of the present disclosure provide a display panel, including the substrate, the plurality of rows of first light-emitting devices, the plurality of rows of first pixel drive circuits, and the plurality of rows of second pixel drive circuits that are disposed within the conventional display region of the substrate, and the plurality of rows of second light-emitting devices disposed within the light-transmissive display region of the substrate. The first pixel drive circuit is electrically connected to the first light-emitting device, and the second pixel drive circuit is electrically connected to the second light-emitting device. That is, the pixel drive circuit of the second light-emitting device within the light-transmissive display region is disposed in the conventional display region. In this way, the pixel drive circuit is not required to be arranged in a peripheral region, such that a size of the peripheral region is reduced, and thus the problem of the large frame of the display panel in some practices is solved, and an effect of reducing the frame of the display panel is achieved.

In addition, in the embodiments of the present disclosure, the length of the connection wiring connecting the second light-emitting device to the second pixel drive circuit is short, such that the second light-emitting device of the light-transmissive display region responds fast, and thus the display refresh rate of the display panel is improved. Meanwhile, the display effect of the light-transmissive display region in displaying low grayscale pictures is improved, and thus the entire display effect of the light-transmissive display region is further improved.

Some embodiments of the present disclosure provide a display device. The display device is: a mobile phone, a tablet, a television, a display, a notebook, a digital photo frame, a navigator, or any product or component with a display function.

The display device includes a photosensitive sensor and the display panel as described above. The photosensitive sensor is an image sensor, a light sensor, or a distance sensor in a camera. The image sensor is configured to perform face or fingerprint recognition. An orthographic projection of a light incident surface of the photosensitive sensor on a substrate of the display panel is within a light-transmissive display region.

It should be pointed out that in the accompanying drawings, the sizes of layers and regions may be exaggerated for clearer illustration. It should be understood that in the case that an element or layer is referred to as being "on" another element or layer, it may be directly on another element, or intervening layers may be present. In addition, it should be understood that in the case that an element or layer is referred to as being "under" another element or layer, the layer may be directly under the other element, or there may be more than one intervening layer or element. In addition, it can further be understood that in the case that a layer or element is referred to as being "between" two layers or two elements, the layer may be the only layer between the two layers or two elements, or more than one intervening layer or element may also be present. Similar reference numerals indicate similar elements throughout.

In the present disclosure, the terms "first" and "second" are only used for descriptive purposes, and cannot be understood as indicating or implying relative importance. The term "a plurality of" refers to two or more, unless expressly defined otherwise.

Described above are merely exemplary embodiments of the present disclosure, and are not intended to limit the present disclosure. Therefore, any modifications, equivalent substitutions, improvements, and the like made within the spirit and principles of the present disclosure shall be included in the protection scope of the present disclosure.

What is claimed is:

1. A display panel, comprising:
   a substrate, comprising a light-transmissive display region and a conventional display region surrounding the light-transmissive display region;
   a plurality of first pixel drive circuits disposed in the conventional display region, comprising a plurality of groups of the first pixel drive circuits, wherein each group of the plurality of groups of the first pixel drive circuits is arranged along a first direction, and the plurality of groups of the first pixel drive circuits are arranged along a second direction, the first direction being intersected with the second direction;
   a plurality of first light-emitting devices disposed in the conventional display region, wherein the plurality of first light-emitting devices are electrically connected to the plurality of first pixel drive circuits, orthographic projections of the plurality of first light-emitting devices on the substrate being at least partially overlapped with orthographic projections of the plurality of first pixel drive circuits on the substrate;
   a plurality of second pixel drive circuits disposed in the conventional display region, comprising a plurality of groups of the second pixel drive circuits, wherein each group of the plurality of groups of the second pixel drive circuits is arranged along the first direction, and the plurality of groups of the second pixel drive circuits are arranged along the second direction and spaced apart between the plurality of groups of the first pixel drive circuits; and
   a plurality of second light-emitting devices disposed in the light-transmissive display region, wherein the plurality of second light-emitting devices are electrically connected to the plurality of groups of the second pixel drive circuits by a conductive wiring,
   wherein in the second direction, a ratio of a number of the first pixel drive circuits to a number of the second pixel drive circuits is greater than 1.

2. The display panel according to claim 1, wherein the plurality of second light-emitting devices comprise a plurality of groups of the second light-emitting devices, wherein each group of the plurality of groups of the second light-emitting devices is arranged along the first direction, and the plurality of groups of the second light-emitting devices are arranged along the second direction, at least one group of the second pixel drive circuits in the plurality of groups of the second pixel drive circuits being electrically connected to at least one group of the second light-emitting devices in the plurality of groups of the second light-emitting devices.

3. The display panel according to claim 2, wherein an arrangement direction of the at least one group of the second pixel drive circuits and an arrangement direction of the corresponding at least one group of the second light-emitting devices are parallel to the first direction, and the at least one group of the second pixel drive circuits is disposed on at least one side, in the first direction, of the corresponding at least one group of the second light-emitting devices.

4. The display panel according to claim 3, wherein the at least one group of the second pixel drive circuits is disposed on both sides, in the first direction, of the corresponding at least one group of the second light-emitting devices.

5. The display panel according to claim 3, wherein the at least one group of the second pixel drive circuits in the plurality of groups of the second pixel drive circuits comprises a first sub-pixel drive circuit group and a second sub-pixel drive circuit group, the first sub-pixel drive circuit group and the second sub-pixel drive circuit group being symmetrically disposed with respect to the light-transmissive display region.

6. The display panel according to claim 1, wherein the plurality of second light-emitting devices comprise a plurality of groups of the second light-emitting devices;
   wherein each group of the plurality of groups of the second light-emitting devices is arranged along the second direction, and the plurality of groups of the second light-emitting devices are arranged along the first direction, at least one group of the second pixel drive circuits in the plurality of groups of the second pixel drive circuits being electrically connected to at least one group of the second light-emitting devices in the plurality of groups of the second light-emitting devices.

7. The display panel according to claim 1, wherein the plurality of second light-emitting devices comprise a plurality of groups of the second light-emitting devices, wherein each group of the plurality of groups of the second light-emitting devices is arranged along a third direction, and the plurality of groups of the second light-emitting devices are arranged along a fourth direction, the first direction, the second direction, the third direction, and the fourth direction being not coincided.

8. The display panel according to claim 1, further comprising: a plurality of groups of virtual pixel drive circuits disposed in the conventional display region, wherein at least one group of the plurality groups of the virtual pixel drive circuits is arranged along the first direction and is disposed on a side, distal from the light-transmissive display region, of at least one group of the second pixel drive circuits.

9. The display panel according to claim 1, further comprising: a plurality of groups of virtual pixel drive circuits disposed in the conventional display region, wherein the plurality of groups of virtual pixel drive circuits are spaced apart between the plurality of groups of the second pixel drive circuits.

10. The display panel according to claim 4, wherein the light-transmissive display region comprises two light-transmissive sub-regions arranged along the first direction;
wherein the second light-emitting device within one of the two light-transmissive sub-regions is correspondingly electrically connected to the second pixel drive circuit disposed on a first side of the one of the two light-transmissive sub-regions, the first side being a side, distal from another of the two light-transmissive sub-regions, of the one of the two light-transmissive sub-regions.

11. The display panel according to claim 10, wherein areas of the two light-transmissive sub-regions are equal.

12. The display panel according to claim 1, wherein the at least one group of the second pixel drive circuits in the plurality of groups of the second pixel drive circuits is adjacent to the light-transmissive display region.

13. The display panel according to claim 2, wherein a plurality of the second pixel drive circuits corresponding to a group of the second light-emitting devices are successively arranged in the first direction.

14. The display panel according to claim 2, wherein a group of the second pixel drive circuits is correspondingly electrically connected to three to eight groups of the second light-emitting devices.

15. The display panel according to claim 14, wherein in the second direction, a distance between any group of the second light-emitting devices in at least two groups of the second light-emitting devices and a target group of the second pixel drive circuits is positively correlated with a first length, the first length being a length of a conductive wiring between the second light-emitting device in the any group of the second light-emitting devices and the target group of the second pixel drive circuits.

16. The display panel according to claim 8, further comprising: a gate drive circuit disposed on the substrate;
wherein the gate drive circuit comprises a plurality of first gate drive units correspondingly electrically connected to the plurality of groups of the first pixel drive circuits, and a plurality of second gate drive units correspondingly electrically connected to the plurality of groups of the second pixel drive circuits.

17. The display panel according to claim 8, further comprising: a gate drive circuit disposed on the substrate, and an independent signal wiring correspondingly electrically connected to the plurality of groups of the second pixel drive circuits; wherein the gate drive circuit comprises a plurality of first gate drive units correspondingly electrically connected to the plurality of groups of the first pixel drive circuits; and
the plurality of groups of the second pixel drive circuits are configured to be electrically connected to a drive chip by the independent signal wiring.

18. The display panel according to claim 16, wherein the plurality of second gate drive units are electrically connected to the plurality of groups of the second pixel drive circuits by a first connection wiring; and
the at least one group of the virtual pixel drive circuits in the plurality of groups of virtual pixel drive circuits is disposed between the second gate drive unit and the at least one group of the second pixel drive circuits.

19. The display panel according to claim 18, further comprising: an initialization power supply bus disposed on the substrate, wherein the initialization power supply bus is disposed between the gate drive circuit and the virtual pixel drive circuit, and is connected to the second pixel drive circuit by a second connection wiring.

20. A display device, comprising: a photosensitive sensor and a display panel, wherein
the display panel comprises:
a substrate, comprising a light-transmissive display region and a conventional display region surrounding the light-transmissive display region;
a plurality of first pixel drive circuits disposed in the conventional display region, comprising a plurality of groups of the first pixel drive circuits, wherein each group of the plurality of groups of the first pixel drive circuits is arranged along a first direction, and the plurality of groups of the first pixel drive circuits are arranged along a second direction, the first direction being intersected with the second direction;
a plurality of first light-emitting devices disposed in the conventional display region, wherein the plurality of first light-emitting devices are electrically connected to the plurality of first pixel drive circuits, orthographic projections of the plurality of first light-emitting devices on the substrate being at least partially overlapped with orthographic projections of the plurality of first pixel drive circuits on the substrate;
a plurality of second pixel drive circuits disposed in the conventional display region, comprising a plurality of groups of the second pixel drive circuits, wherein each group of the plurality of groups of the second pixel drive circuits is arranged along the first direction, and the plurality of groups of the second pixel drive circuits are arranged along the second direction and spaced apart between the plurality of groups of the first pixel drive circuits; and
a plurality of second light-emitting devices disposed in the light-transmissive display region, wherein the plurality of second light-emitting devices are electrically connected to the plurality of groups of the second pixel drive circuits by a conductive wiring; and
an orthographic projection of a light incident surface of the photosensitive sensor on the substrate of the display panel is within the light-transmissive display region,
wherein in the second direction, a ratio of a number of the first pixel drive circuits to a number of the second pixel drive circuits is greater than 1.

* * * * *